United States Patent
Chih et al.

(10) Patent No.: US 7,663,916 B2
(45) Date of Patent: Feb. 16, 2010

(54) LOGIC COMPATIBLE ARRAYS AND OPERATIONS

(75) Inventors: Yue-Der Chih, Hsin-Chu (TW); Te-Hsun Hsu, Hsin-Chu (TW)

(73) Assignee: Taiwan Semicondcutor Manufacturing Company, Ltd., Hsin-Chu (TW)

(*) Notice: Subject to any disclaimer, the term of this patent is extended or adjusted under 35 U.S.C. 154(b) by 324 days.

(21) Appl. No.: 11/787,291

(22) Filed: Apr. 16, 2007

(65) Prior Publication Data

US 2008/0251832 A1    Oct. 16, 2008

(51) Int. Cl.
*G11C 11/34*    (2006.01)
(52) U.S. Cl. ............... 365/185.05; 365/63; 365/149
(58) Field of Classification Search ........... 365/185.05, 365/63, 149
See application file for complete search history.

(56) References Cited

U.S. PATENT DOCUMENTS

| | | | |
|---|---|---|---|
| 4,099,196 A * | 7/1978 | Simko ................ 257/317 |
| 5,293,337 A | 3/1994 | Aritome et al. |
| 5,295,096 A | 3/1994 | Nakajima |
| 5,323,039 A | 6/1994 | Asano et al. |
| 5,446,303 A | 8/1995 | Quill et al. |
| 5,793,673 A | 8/1998 | Pio et al. |
| 5,859,454 A * | 1/1999 | Choi et al. ............... 257/316 |
| 5,889,700 A | 3/1999 | Bergemont et al. |
| 6,172,392 B1 | 1/2001 | Schmidt et al. |
| 6,295,229 B1 | 9/2001 | Chang et al. |
| 6,512,699 B2 | 1/2003 | Ogane |
| 6,734,065 B2 | 5/2004 | Yim et al. |
| 6,788,574 B1 | 9/2004 | Han et al. |
| 6,881,626 B2 | 4/2005 | Lee et al. |
| 7,326,994 B2 | 2/2008 | Hsu et al. |
| 2002/0100930 A1 | 8/2002 | Yaegashi |
| 2003/0197238 A1 | 10/2003 | Park |
| 2004/0217441 A1 | 11/2004 | Lehmann et al. |

* cited by examiner

*Primary Examiner*—Son Dinh
(74) *Attorney, Agent, or Firm*—Slater & Matsil, L.L.P.

(57) ABSTRACT

An array of memory cells arranged in a plurality of rows and a plurality of columns are provided. The array includes a first program line in a first direction, wherein the first program line is connected to program gates of memory cells in a first row of the array; a first erase line in the first direction, wherein the first erase line is connected to erase gates of the memory cells in the first row of the array; and a first word-line in the first direction, wherein the first word-line is connected to word-line nodes of the memory cells in the first row of the array.

17 Claims, 6 Drawing Sheets

_US 7,663,916 B2_

LOGIC COMPATIBLE ARRAYS AND OPERATIONS

CROSS-REFERENCE TO RELATED APPLICATIONS

This application relates to the following co-pending and commonly assigned patent application: Ser. No. 11/248,357, filed Oct. 12, 2005, entitled Logic Compatible Non-Volatile Memory Cell, which application is hereby incorporated herein by reference.

TECHNICAL FIELD

This invention relates generally to semiconductor devices, and more particularly to memory cells and arrays, and even more particularly to the structure and manufacturing methods of multiple-times programming memory (MTP) cells and arrays.

BACKGROUND

A multiple-times programming (MTP) memory cell retains information stored in the memory cell even when the power is turned off. To create a MTP memory cell, typically, a standard CMOS-based logic process is used as a starting foundation. Next, additional process steps are incorporated into the logic process flow to create the MTP memory cell. Examples of such additional process steps include second polysilicon deposition, junction dopant optimization, etc. Integrating MTP-specific process steps into the standard CMOS-based logic process creates complications. Consequently, embedded MTP memory technologies generally lag behind advanced logic fabrication processes by several generations. For a system-on-chip (SOC) approach, which requires embedding a MTP memory, a design team typically has no choice but to accept a logic flow process usually two to three generations behind the current advanced standard logic process as well as an additional seven to eight lithographic masks in addition to that process. This prior approach not only increases the wafer cost, but it also falls short of the peak performance that the most advanced standard logic process can deliver.

Structures and fabrication methods have therefore been explored to solve the above-discussed problems. FIG. 1 illustrates a perspective view of a conventional MTP memory cell 100, which includes transistor 102, first capacitor 104, second capacitor 106, and third capacitor 108. First capacitor 104, second capacitor 106 and third capacitor 108 share a common floating gate 110. Transistor 102 is controlled by word-line 120, which determines whether a voltage applied on bit-line 122 can be applied into memory cell 100 or not. Source line 124 is connected to transistor 104.

In one embodiment, the program and erase operations of MTP memory cell 100 are achieved by tunneling electrons into and out of floating gate 110. For example, to program MTP memory cell 100, a high voltage is applied to program gate 112, while erase gate 114 is grounded. Due to the capacitive coupling of the coupling capacitors 106 and 108, a large voltage drop is produced across the two plates of tunneling capacitor 108, resulting in a high electrical field between the two plates. When the electrical field is sufficiently high for Fowler Nordheim tunneling to occur, electrons in floating gate 110 tunnel through the insulating material between floating gate 110 and the connecting well region 116.

Conversely, by applying a high voltage to erase gate 114 and program gate 112, electrons can tunnel out of floating gate 110 to source line 124, and thus the negative charge in the floating gate is reduced.

The MTP memory cell 100 shown in FIG. 1 suffers drawbacks, however. Since erase gates of all memory cells in a column are interconnected, and program gates of all memory cells in a row are interconnected, in order to erase a selected memory, high voltages need to be applied to the respective column and row of the selected memory cell. Accordingly, all the array, in which the selected memory array is located, needs to be erased. In addition, high voltages adversely causes program disturbance to other rows and columns. Furthermore, erase gates are formed of big well regions. Erase gate well regions 118 of memory cells in a same row have to be electrically disconnected from each other since they need to be connected to different voltages. The neighboring well regions 118 in a row also need to have adequate well spacing. This results in an increase in the size of the memory cells.

What is needed, therefore, is an improved MTP memory cell and array structure having reduced program disturbance and requiring less chip area.

SUMMARY OF THE INVENTION

In accordance with one aspect of the present invention, an array of memory cells arranged in a plurality of rows and a plurality of columns includes a first program line in a first direction, wherein the first program line is connected to program gates of memory cells in a first row of the array; a first erase line in the first direction, wherein the first erase line is connected to erase gates of the memory cells in the first row of the array; and a first word-line in the first direction, wherein the first word-line is connected to word-line nodes of the memory cells in the first row of the array.

In accordance with another aspect of the present invention, an array of memory cells arranged in a plurality of rows and a plurality of columns includes a plurality of pages. Each of the plurality of pages includes a first row of memory cells; a second row of memory cells, wherein the first row is adjacent to the second row; a program line in a row direction, wherein the program line is connected to program gates of memory cells in the first and the second rows, and wherein the program line is disconnected from program lines in other pages; an erase line in the row direction, wherein the erase line is connected to erase gates of memory cells in the first and the second rows, and wherein the erase line is disconnected from erase lines in other pages; a first word-line in the row direction, wherein the first word-line is connected to word-line nodes of the memory cells in the first row; and a second word-line in the row direction, wherein the second word-line is connected to word-line nodes of the memory cells in the second row. The array further includes a plurality of bit-lines in a column direction, wherein each of the plurality of bit-lines is connected to bit-line nodes of memory cells in a same column and having a same row number in each page, and wherein the plurality of bit-lines are disconnected from each other.

In accordance with yet another aspect of the present invention, an array of memory cells arranged in a plurality of rows and a plurality of columns includes a plurality of pages, wherein each page includes only one row of memory cells; a program line in a row direction, wherein the program line is connected to program gates of memory cells in the row, and wherein the program line is disconnected from program lines in other pages; an erase line in the row direction, wherein the erase line is connected to erase gates of memory cells in the row, and wherein the erase line is disconnected from erase lines in other pages; and a word-line in the row direction, wherein the word-line is connected to word-line nodes of the memory cells in the row. The array further includes a plurality of bit-lines in a column direction, wherein each of the plurality of bit-lines is connected to bit-line nodes of memory cells in a same column, and wherein the plurality of bit-lines are disconnected from each other.

In accordance with yet another aspect of the present invention, a method of forming and operating an array of memory cells includes forming the array of memory cells in a plurality of rows and a plurality of columns; forming a first program line in a first direction, and connecting the first program line to program gates of memory cells in a first row; forming a first erase line in the first direction, and connecting the first erase line to erase gates of the memory cells in the first row; and forming a first word-line in the first direction, and connecting the first word-line to word-line nodes of the memory cells in the first row.

In accordance with yet another aspect of the present invention, a method of forming and operating an array of memory cells includes forming the array of memory cells in a plurality of rows and a plurality of columns and grouping the plurality of rows into a plurality of pages. The steps of forming the memory cells and grouping includes forming a first row of memory cells; forming a second row of memory cells, wherein the first row is adjacent to the second row; forming a program line in a row direction and connecting the program line to program gates of the memory cells in the first and the second rows; forming a erase line in the row direction and connecting the erase line to erase gates of the memory cells in the first and the second rows; forming a first word-line in the row direction, wherein the first word-line is connected to word-line nodes of the memory cells in the first row; and forming a second word-line in the row direction, wherein the second word-line is connected to word-line nodes of the memory cells in the second row. The method further includes connecting a plurality of bit-lines in a column direction, wherein each of the plurality of bit-lines is connected to bit-line nodes of memory cells in a same column and having a same row number in each page, and wherein the plurality of bit-lines are disconnected from each other.

In accordance with yet another aspect of the present invention, a method of operating an array of memory cells includes applying a first erase voltage to erase gates of a first row of memory cells; applying a second erase voltage to erase gates of a second row of memory cells, wherein the first and the second erase voltages are different and are simultaneously applied; applying a first program voltage to program gates of the first row of memory cells; and applying a second program voltage to program gates of the second row of memory cells, wherein the first and the second program voltages are different and are simultaneously applied.

The advantageous features of the present invention include reduced memory cells size, reduced program disturb and the ability for page-wise erasing.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
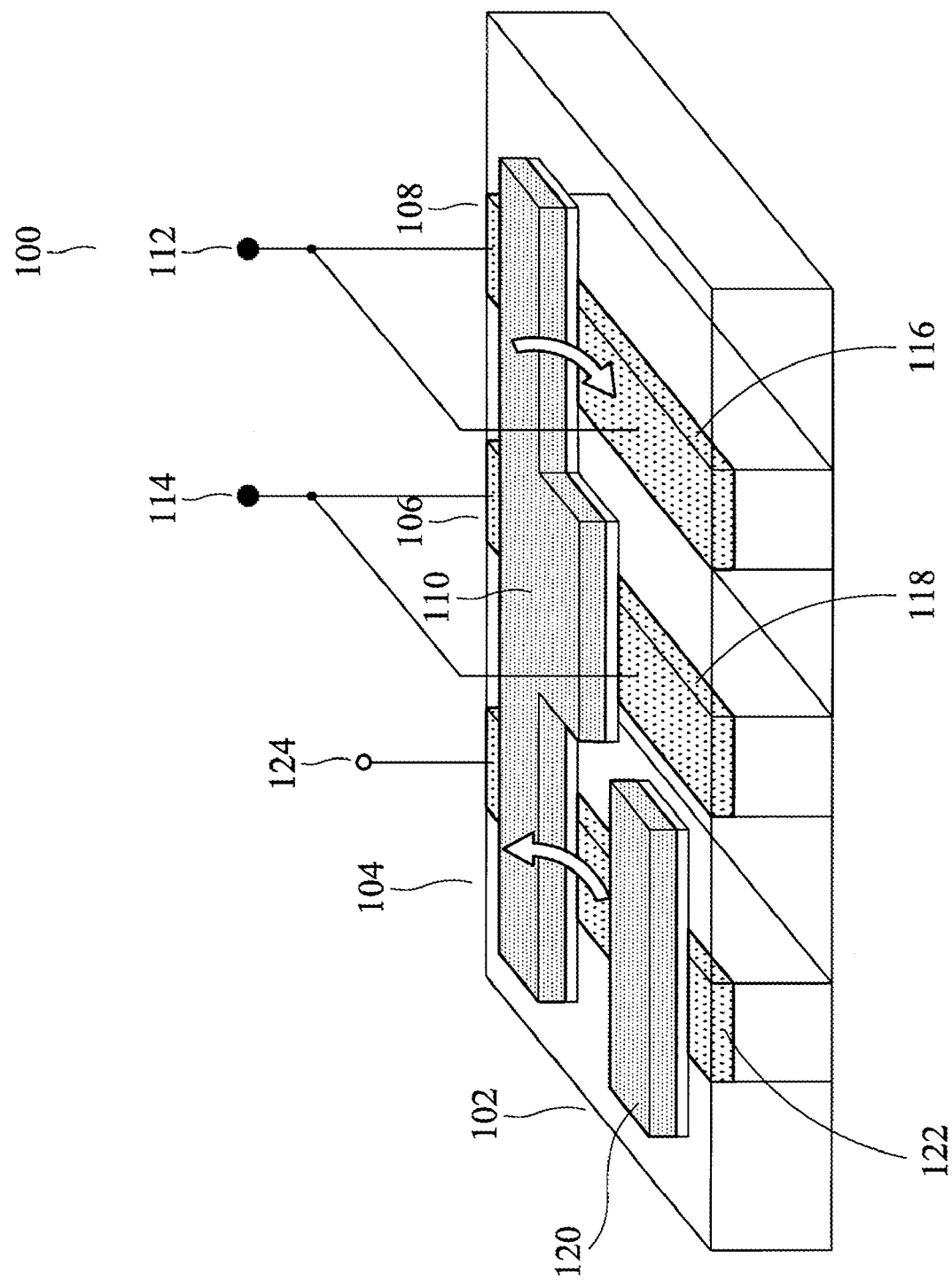
FIG. 1 illustrates a conventional multiple-times programming (MTP) memory cell, wherein a bit-line node is adjacent a word-line.
Figure 2:
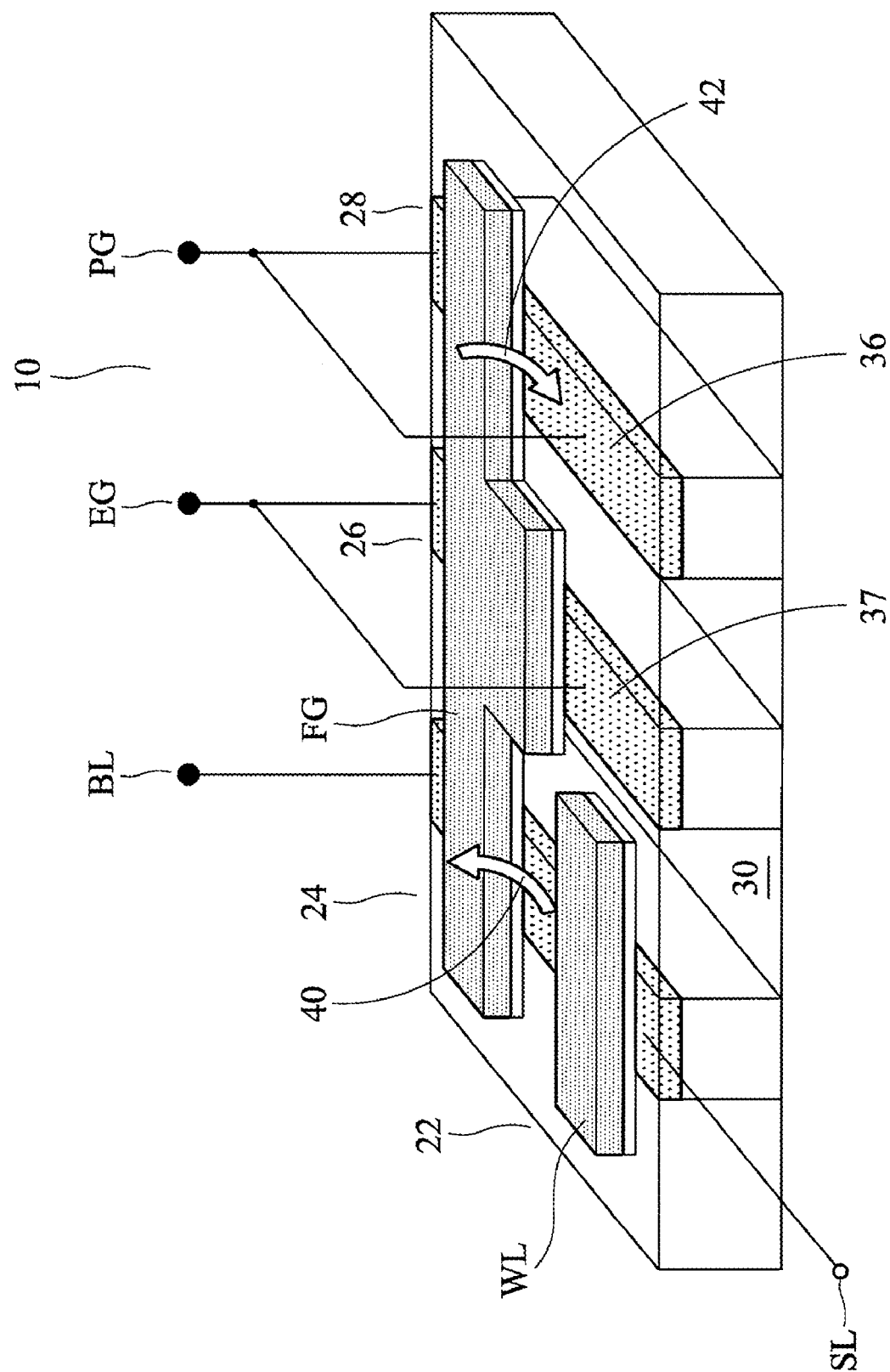
FIG. 2 illustrates a MTP memory cell embodiment of the present invention, wherein a source line node is adjacent a word-line.

FIG. 2 illustrates a perspective view of a multiple-times programming (MTP) memory cell 10, which includes transistor 22, first capacitor 24, second capacitor (also referred to as a coupling capacitor) 26, and third capacitor 28. First capacitor 24, second capacitor 26 and third capacitor 28 share a common floating gate FG. Transistor 22 is controlled by word-line WL, which controls the selection of current memory cell 10. Bit-line BL is connected to transistor 22. It is noted that source line SL and bit-line BL are swapped as compared to conventional connections. Coupling capacitor 26 is formed of floating gate FG and erase gate well region 37, each acting as a capacitor plate. Typically, erase gate well region 37 has a significantly greater area than other well regions, such as program gate well region 36.

Table 1 shows exemplary voltages for performing read, program and erase operations on memory cell 10, wherein VPG, VEG, VWL, VBL, VSL and VB are preferred voltages on program gate PG, erase gate EG, word-line WL, bit-line BL, source line SL and substrate 30, respectively. Please note that the voltages provided in Table 1 are only examples, and different voltages, even different program and erase mechanisms, may be provided.

TABLE 1

| | Voltage | | | | | |
|---|---|---|---|---|---|---|
| | VPG(V) | VEG(V) | VWL(V) | VBL(V) | VSL(V) | VB(V) |
| Read | 0/0 | 0/0 | 1.2/0 | 0.8/0 | 0/0 | 0 |
| Erase | 10/0 | 0 | 0 | 0 | 0 | 0 |
| Program | 10/2 | 10/2 | 0 | 0/4 | 0 | 0 |

Each cell in Table 1 shows either one or two voltages. If two voltages are present, the first voltage will be applied to a memory cell selected to have a certain operation performed on, and the second voltage will be applied to the memory cells not selected. If only one voltage is present, memory cells, selected or not, will be subjected to the same voltages. Throughout the description, if a memory cell is selected, the corresponding row in which the selected memory cell is located is referred to as the selected row, and the corresponding column in which the selected memory cell is located is referred to as the selected column. Accordingly, the rows and columns different from the selected row and selected column are referred to as unselected rows and unselected columns, respectively.

In the example provided in Table 1, if a program operation is to be performed to a selected memory cell, high voltages, for example, 10 volts, are applied to program gate PG and erase gate EG of the selected memory cell, while bit-line BL is applied with a low voltage of 0V. Accordingly, a high voltage is coupled onto floating gate FG, and thus electrons are programmed into floating gate FG, as is symbolized by arrow 40 in FIG. 2.

In the preferred embodiment, erase gates of memory cells in a same row are interconnected, and program gates of memory cells in a same row are also interconnected. Therefore, the unselected memory cells in the selected row are applied with same high erase gate voltages and high program gate voltages as the selected memory cell. An inhibit voltage, for example, about 4V, is thus applied to the bit-lines of the unselected memory cells. The inhibit voltage reduces the voltage difference between the respective bit-lines BL and floating gates FG of the unselected memory cells, and thus no programming occurs for the unselected memory cells in the selected row. Advantageously, the swapping of bit-line BL and source line SL makes it possible to directly apply the inhibit voltage to the plate of first coupling capacitor 24. It is appreciated that if bit-line BL is in the position of the source line SL, the corresponding word-line WL needs to be undesirably applied with a voltage higher than the inhibit voltage in order to turn on the channel of transistor 22. Preferably, the inhibit voltage is between 0V and the voltage applied to program gate PG. More preferably, the inhibit voltage is close to a half of the voltage coupled on the floating gates FG of the unselected memory cells in the selected row.

During the program operation of the selected memory cell, the erase gates and program gates of unselected rows may be applied with a low voltage, such as 2V. This has the advantageous feature of reducing the voltage difference between bit-lines BL and floating gates FG of the memory cells in unselected rows, since some of these memory cells have inhibit voltages applied to their bit-lines.

If an erase operation is to be performed to a selected memory cell, a high voltage of 10 volts may be applied to program gate PG, while erase gate EG and bit-line BL may be applied with a low voltage of 0V. Accordingly, a low voltage is coupled onto floating gate FG, generating a high voltage difference between floating gate FG and program gate PG, and thus electrons are erased out of floating gate FG, as is symbolized by arrow 42 in FIG. 2. Preferably, the erase operation is performed row-wise or page-wise, and thus all memory cells in a row or a page will be selected simultaneously. The details of row-wise or page-wise erase are discussed in detail in subsequent paragraphs. Accordingly, the memory cells in unselected rows or pages will have their erase gates and program gates applied with low voltages, such as 0V.

If a read operation is to be performed on a selected memory cell, its program gate PG and erase gate EG are both applied with a low voltage of 0V. Its word-line WL is applied with a voltage of 1.2V to turn on the respective transistor 22. Bit-line BL of the selected memory cell is applied with a low voltage of 0.8V. Accordingly, the state of the respective floating gate FG determines the operating state of transistor 24, and thus the state of floating gate FG may be determined accordingly.

Figure 3:
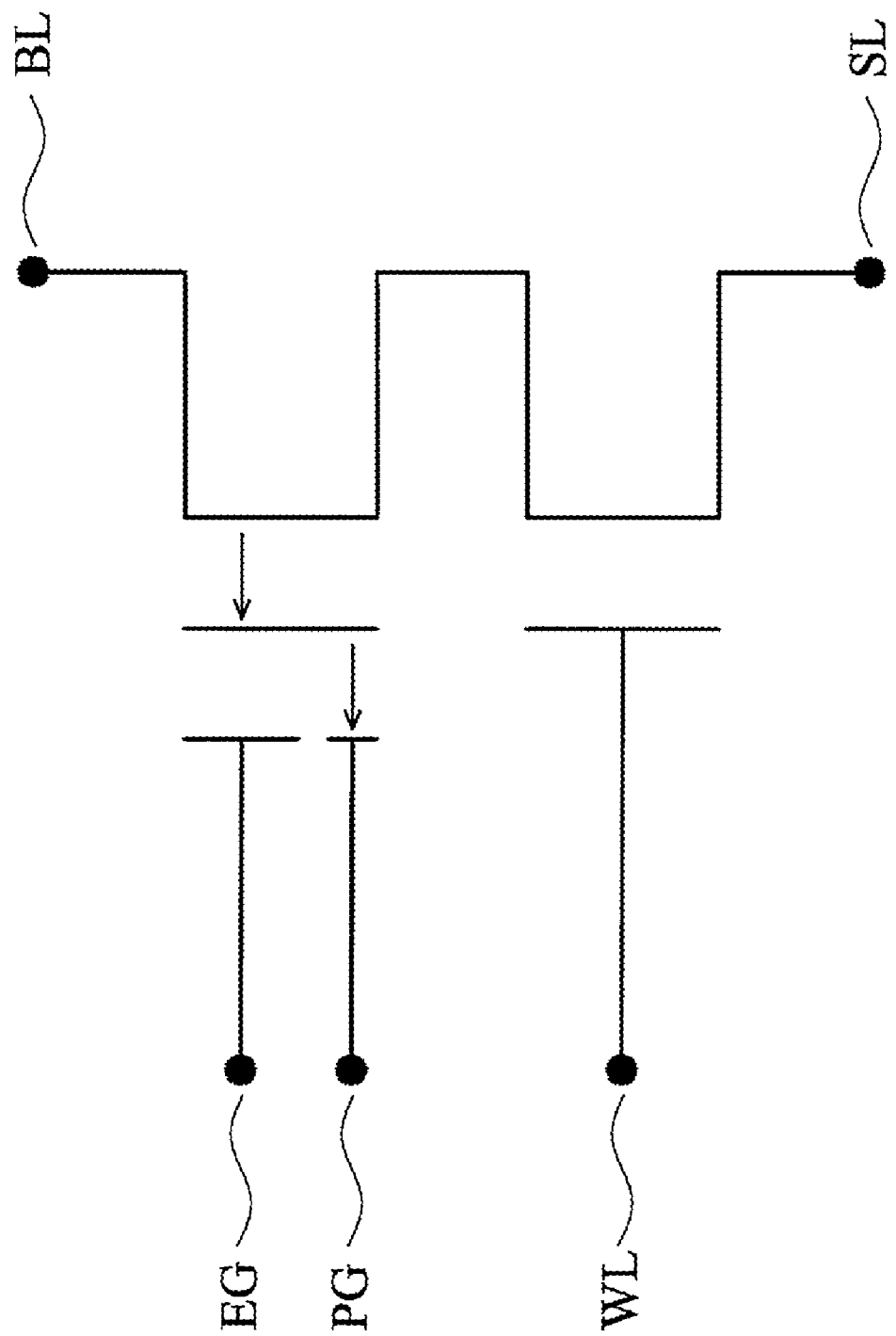
FIG. 3 illustrates a symbol of the MTP memory cell shown in FIG. 2.

FIG. 3 illustrates a symbol of the memory cell shown in FIG. 2, wherein like reference notations in FIG. 2 are indicated in FIG. 3.

Figure 4:
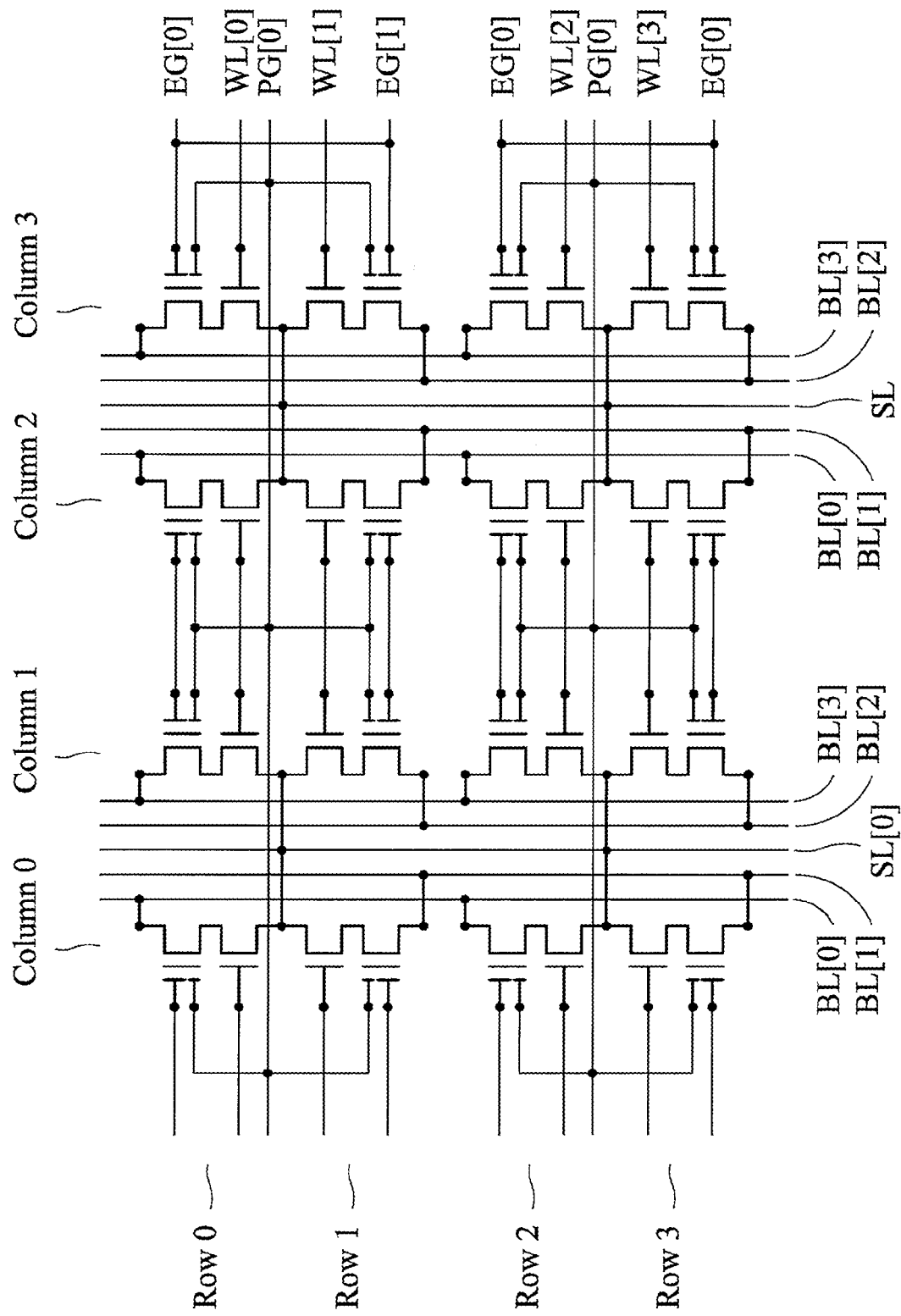
FIG. 4 illustrates a portion of a two-row-per-page memory array, wherein a page includes two rows of memory cells.

FIG. 4 illustrates an embodiment for connecting memory cells as an array, which includes a plurality of memory cells arranged as rows and columns. For simplicity, only a portion having four rows and four columns is illustrated. The illustrated rows and columns are referred to as row 0 through row 3 and column 0 through column 3, respectively. In the preferred embodiment, program lines PG[0] and [PG[1], erase lines EG[0] and EG[1], and word-lines WL[0] through WL[3] are in a same direction and are each connected to memory cells in a row. The source lines of memory cells in a same column is connected to one of the source lines SL[0] and SL[1].

Preferably, rows are grouped as pages, wherein each page may include a selected number of rows, such as 2, 4, and 8, etc. Rows in a same page share a common program line PG and a common erase line EG. In the embodiment shown in FIG. 4, each page includes two rows. Row 0 and row 1 are in a first page, and thus sharing erase line EG[0] and program line PG[0]. Row 2 and row 3 are in a second page, and thus sharing erase line EG[1] and program line PG[1]. Preferably, a memory cell in each page shares a common bit-line with the memory cells having the same row number and column number in other pages, while memory cells in a same column and a same page, but in different rows, are connected to different bit-lines. Accordingly, each column of the memory cells is connected to two bit lines. For example, bit-lines BL[0] and BL[1] are connected to column 0, and bit-lines BL[2] and BL[3] are connected to column 1. The number of bit-lines for each column is thus preferably equal to the number of rows in each page. The bit-lines are preferably disconnected from each other.

Since erase gates and program gates of the memory cells in one row are interconnected, page-wise erase is feasible, in which only a page of memory cells is erased simultaneously. Page-wise erase is advantageous over conventional array-wise erase, in which all memory cells in an array are erased simultaneously.

In an erase operation, assuming the first page, which includes row 0 and row 1, are to be erased, erase line EG[0] may then be applied with 0V, program line PG[0] may be applied with a high voltage. Row 0 and row 1 are thus erased simultaneously. In the meantime, the second page, which includes row 2 and row 3, are not to be erased. Therefore, erase line EG[1] and program line PG[1] are applied with a low voltage of 0V. It is appreciated that the applied voltages are also examples, and may have different values.

For the program operation, assuming the memory cell in row 0 and column 0 is to be programmed, and thus is the selected memory cell. Erase line EG[0] and program line PG[0], which are connected to the first page, are applied with a high voltage, for example, 10V, while bit-line BL[0] is applied with a low voltage of 0V. The selected memory is thus programmed. The unselected memory cells in the selected page (the first page) are preferably not programmed. Therefore, bit-lines BL[1], BL[2], BL[3], BL[4], BL[5], BL[6] and BL[7] are applied with an inhibit voltage, for example, 4V. Accordingly, unselected memory cells in the selected page are prohibited from being programmed. In the meantime, for the unselected second page, erase line EG[1] and program line PG[1], which are connected to the second page, are applied with a low voltage, for example, 0V.

Figure 5:
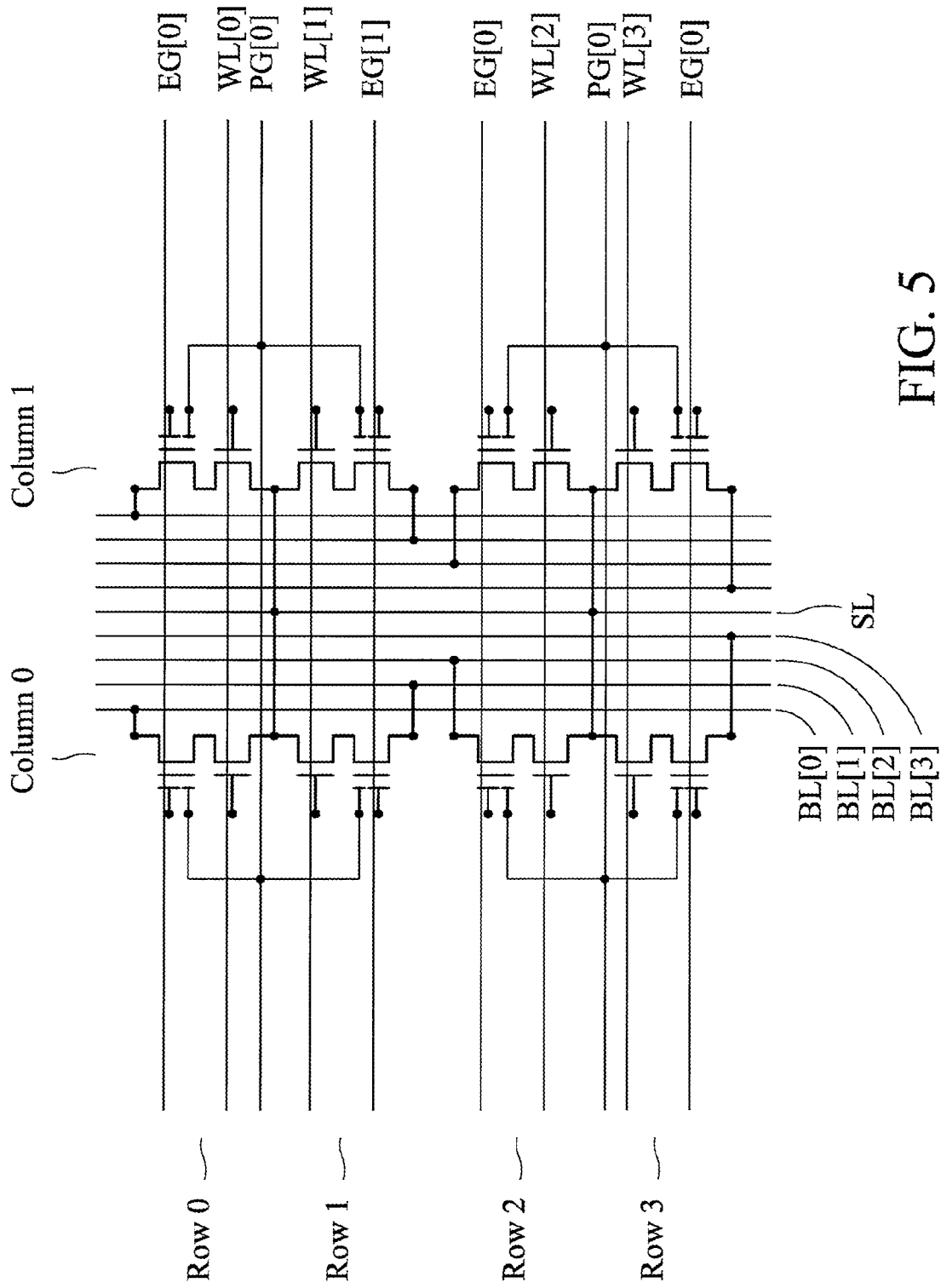
FIG. 5 illustrates a portion of a four-row-per-page memory array, wherein a page includes four rows of memory cells.

An advantageous feature of the present invention is that in the row direction of the array, which is the same direction of word-lines (such as WL[0] in FIG. 4), there is adequate space to accommodate more bit-lines. More variations of the preferred embodiment are thus possible. FIG. 5 illustrates an embodiment taking advantage of the space in the row direction. A memory array shown in FIG. 5 has four rows included in a same page, wherein all of the four rows share a common erase line EG[0] and a common program line PG[0]. As discussed in the preceding paragraphs, a memory cell in each page preferably shares a common bit-line with the memory cells having the same row number and same column number in other pages. Therefore, bit-line BL[0] is connected to the memory cell in row 0, column 0 and other memory cells in row 0, column 0 in other pages. The memory cells in a same page and a same column, but in different rows, are connected to different bit-lines. With four rows in each page, four bit-lines, for example, bit-lines BL[0] through BL[3] are needed for each column. For an erase operation of the page, an entire page is erased by applying a high voltage to erase line EG[0] and a low voltage to program line PG[0]. For a program operation of a selected cell, the bit-line connected to the selected memory cell is applied with 0V, while other bit-lines connected to the unselected memory cells are applied with the inhibit voltage.

Figure 6:
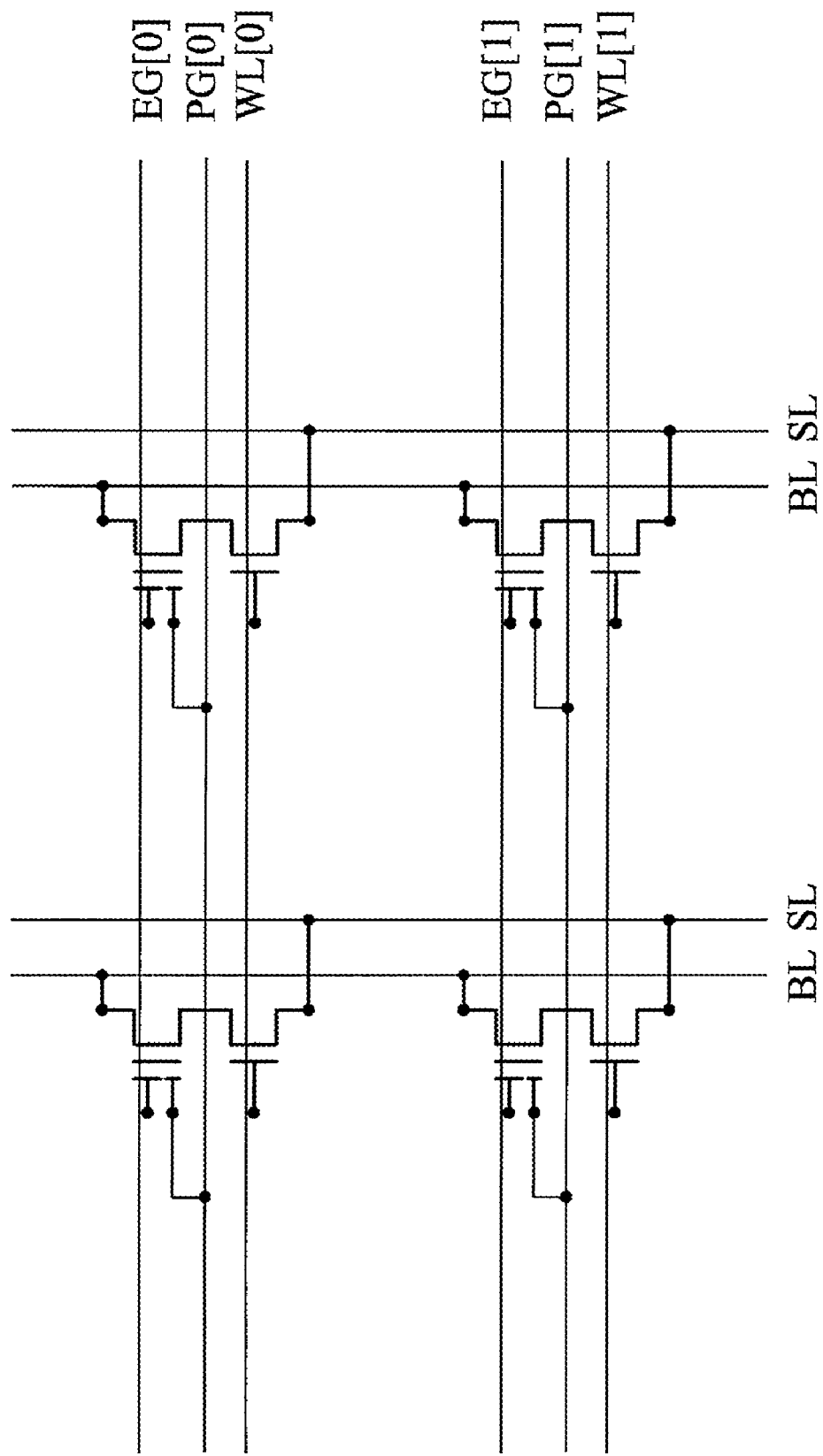
FIG. 6 illustrates a portion of a one-row-per-page memory array, wherein a page includes only one row of memory cells.

If more rows, such as 8 rows, 16 rows, and the like, are desired to be included in a page, more bit-lines may be formed to connect to different rows in a same page and a same column. In other embodiments of the present invention, each page may include only one row, and thus each erase line and each program line are only used by one row of memory cells. An exemplary one-row-per-page array is shown in FIG. 6, in which bit-lines BL, source line SL, program lines PG[0] and PG[1], erase lines EG[0] and EG[1], and word-lines WL[0] and WL[1] are marked.

The embodiments of the present invention have several advantageous features. Since erase lines and program lines are arranged in a same direction, the high voltages used in program and erase operations may be confined in one page, and thus program disturbance to other pages is at least reduced, and possibly eliminated. The erase operation can be performed page-wise, as opposed to conventional array-wise erase, the efficiency is thus improved. A further advantageous feature is that the size of the memory cells can be significantly reduced. In conventional designs, wherein erase lines are perpendicular to program lines, since neighboring memory cells in a same row need to have their erase gate well regions electrically separated, the memory cells are large. For example, a conventional single cell needs about 23 $\mu m^2$ chip area, while a conventional dual cell needs about 46 $\mu m^2$. In the embodiments of the present invention, since memory cells in a same row share a common erase line, the neighboring memory cells may share a common well region for their erase gates. Accordingly, a single cell may be as small as about 9.2 $\mu m^2$, while a dual cell can be as small as about 18.4 $\mu m^2$, both are about 60 percent reduction over conventional memory cells.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An array of memory cells arranged in a plurality of rows and a plurality of columns, the array comprising:
   a first program line in a first direction, wherein the first program line is connected to program gates of memory cells in a first row of the array;
   a first erase line in the first direction, wherein the first erase line is connected to erase gates of the memory cells in the first row of the array;
   a bit-line in a second direction perpendicular to the first direction, wherein the bit-line is connected to bit-line nodes of at least a portion of memory cells in a same column; and
   a first word-line in the first direction, wherein the first word-line is connected to word-line nodes of the memory cells in the first row of the array.

2. The array of claim 1, wherein each of the memory cells in the array comprises:
   a semiconductor substrate;
   a floating gate over the semiconductor substrate;
   a first capacitor comprising a first plate, the floating gate, and a dielectric therebetween;
   a second capacitor comprising a second plate, the floating gate, and a dielectric therebetween, wherein the first plate comprises a first doped region and a second doped region in the semiconductor substrate;
   a third capacitor comprising a third plate, the floating gate, and a dielectric therebetween; and
   a transistor comprising:
      a gate electrode over the semiconductor substrate, wherein the gate electrode is connected to a word-line of the array; and
      a first and a second source/drain region substantially aligned with opposite sidewalls of the gate electrode, wherein the second source/drain region is connected to the first doped region of the first capacitor, and wherein the first source/drain region is connected to a source line of the array, and wherein the second doped region of the first capacitor is connected to a bit-line of the array.

3. The array of claim 1 further comprising:
   a second row of memory cells, wherein the second row is adjacent to the first row; and
   a second word-line connected to word-line nodes of memory cells in the second row, wherein the second word-line is parallel to the first word-line, and wherein program gates of the memory cells in the second row are connected to the first program line, and erase gates of the memory cells in the second row are connected to the first erase line.

4. The array of claim 3 further comprising:
   a third row of memory cells;
   a fourth row of memory cells, wherein the third row is adjacent to the fourth row;
   a second program line in the first direction, wherein the second program line is connected to program gates of the memory cells in the third and fourth rows;
   a second erase line in the first direction, wherein the second erase line is connected to erase gates the memory cells in the third and fourth rows;
   a third word-line in the first direction, wherein the third word-line is connected to word-line nodes of the memory cells in the third row;

a fourth word-line in the first direction, wherein the fourth word-line is connected to word-line nodes of the memory cells in the fourth row;

a first bit-line in a second direction perpendicular to the first direction, wherein the first bit-line is connected to bit-line nodes of a memory cell in the first row and a memory cell in the third memory row; and a second bit-line in the second direction, wherein the second bit-line is connected to bit-line nodes of a memory cell in the second row and a memory cell in the fourth memory row, and wherein the first and the second bit-lines are disconnected from each other.

5. The array of claim 4, wherein the first and the second bit-lines are at different voltages.

6. The array of claim 4, wherein the first and the second program lines are at different voltages.

7. The array of claim 4, wherein the first and the second erase lines are at different voltages.

8. The array of claim 1 further comprising a plurality of source lines, each being connected to source line nodes of memory cells in a same column.

9. The array of claim 8, wherein each of the plurality of source lines is connected to source line nodes of memory cells in two neighboring columns.

10. An array of memory cells arranged in a plurality of rows and a plurality of columns, the array comprising:

a plurality of pages each comprising:

a first row of memory cells;

a second row of memory cells, wherein the first row is adjacent to the second row;

a program line in a row direction, wherein the program line is connected to program gates of memory cells in the first and the second rows, and wherein the program line is disconnected from program lines in other pages;

an erase line in the row direction, wherein the erase line is connected to erase gates of memory cells in the first and the second rows, and wherein the erase line is disconnected from erase lines in other pages;

a first word-line in the row direction, wherein the first word-line is connected to word-line nodes of the memory cells in the first row; and a second word-line in the row direction, wherein the second word-line is connected to word-line nodes of the memory cells in the second row; and a plurality of bit-lines in a column direction, wherein each of the plurality of bit-lines is connected to bit-line nodes of memory cells in a same column and having a same row number in each page, and wherein the plurality of bit-lines is disconnected from each other.

11. The array of claim 10 further comprises additional rows in each of the plurality of pages, wherein all rows in each of the plurality of pages share a common program line and a common erase line.

12. The array of claim 10, wherein each page comprises only two rows.

13. The array of claim 10, wherein each page comprises four rows.

14. The array of claim 10 further comprising a plurality of source lines, each being connected to source line nodes of memory cells in a same column.

15. The array of claim 14, wherein each of the plurality of source lines is only connected to source line nodes of memory cells in two neighboring columns.

16. An array of memory cells arranged in a plurality of rows and a plurality of columns, the array comprising:

a plurality of pages, wherein each page comprises:

only one row of memory cells;

a program line in a row direction, wherein the program line is connected to program gates of memory cells in the row, and wherein the program line is disconnected from program lines in other pages;

an erase line in the row direction, wherein the erase line is connected to erase gates of memory cells in the row, and wherein the erase line is disconnected from erase lines in other pages; and a word-line in the row direction, wherein the word-line is connected to word-line nodes of the memory cells in the row; and a plurality of bit-lines in a column direction, wherein each of the plurality of bit-lines is connected to bit-line nodes of memory cells in a same column, and wherein the plurality of bit-lines is disconnected from each other.

17. The array of claim 16 further comprising a plurality of source lines, each being connected to source line nodes of memory cells in a same column.

\* \* \* \* \*